(12) United States Patent
Manousakis et al.

(10) Patent No.: US 11,653,475 B2
(45) Date of Patent: May 16, 2023

(54) THERMALLY CONDUCTIVE MICROTUBES FOR EVENLY DISTRIBUTING HEAT FLUX ON A COOLING SYSTEM

(71) Applicant: Microsoft Technology Licensing, LLC, Redmond, WA (US)

(72) Inventors: Ioannis Manousakis, Heraklion (GR); Husam Atallah Alissa, Redmond, WA (US); Nicholas Andrew Keehn, Kirkland, WA (US); Bharath Ramakrishnan, Kirkland, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 17/164,562

(22) Filed: Feb. 1, 2021

(65) Prior Publication Data
US 2022/0248557 A1    Aug. 4, 2022

(51) Int. Cl.
*H05K 7/20* (2006.01)
*H05K 1/02* (2006.01)
*H05K 1/18* (2006.01)

(52) U.S. Cl.
CPC ........... *H05K 7/203* (2013.01); *H05K 1/0203* (2013.01); *H05K 1/181* (2013.01); *H05K 7/2039* (2013.01); *H05K 2201/064* (2013.01)

(58) Field of Classification Search
CPC .... H05K 7/2039; H05K 7/203; H05K 1/0203; H05K 1/0204; H05K 1/0206; H05K 1/181; H05K 2201/064; H05K 1/09; H05K 2201/0209; H05K 2201/0257; H05K 2201/0323; H01L 51/0048; H01L 23/373
See application file for complete search history.

(56) References Cited

U.S. PATENT DOCUMENTS

| 5,316,080 | A  | * | 5/1994 | Banks | F28F 21/02 |
| | | | | | 257/E23.105 |
| 6,407,922 | B1 | * | 6/2002 | Eckblad | H01L 23/373 |
| | | | | | 257/E23.09 |
| 7,663,883 | B2 | | 2/2010 | Shirakami et al. | |
| 7,743,763 | B2 | * | 6/2010 | Grip | H01L 31/052 |
| | | | | | 136/246 |
| 8,221,667 | B2 | * | 7/2012 | Yao | H01L 23/373 |
| | | | | | 264/261 |
| 9,271,427 | B2 | * | 2/2016 | Kilroy | H01L 23/373 |

(Continued)

FOREIGN PATENT DOCUMENTS

DE        10324377 A1    1/2005

OTHER PUBLICATIONS

Patel, Prachi, "Four New Ways to Chill Computer Chips", In Magazine of IEEE Spectrum, Nov. 25, 2015, 4 Pages.

(Continued)

*Primary Examiner* — Adam B Dravininkas
(74) *Attorney, Agent, or Firm* — Ray Quinney & Nebeker P.C.; Paul N. Taylor

(57) ABSTRACT

An electronics cooling system includes a printed circuit board (PCB) assembly having a heat generating component connected to a base. A plurality of thermally conductive microtubes are connected to the PCB assembly with a first spatial density. The plurality of thermally conductive microtubes are connected to a heat plate of a cooling system with a second spatial density to evenly spread the heat flux of the PCB assembly over the heat plate.

20 Claims, 9 Drawing Sheets

(56) References Cited

U.S. PATENT DOCUMENTS

| | | |
|---|---|---|
| 10,396,009 B2 | 8/2019 | Yamaguchi et al. |
| 10,611,941 B2 | 4/2020 | Hirose et al. |
| 10,770,370 B2 | 9/2020 | Hirose et al. |
| 10,791,651 B2 | 9/2020 | Cola et al. |
| 2005/0046017 A1* | 3/2005 | Dangelo ............... B82Y 10/00 257/E23.098 |
| 2010/0219550 A1 | 9/2010 | Yao et al. |
| 2012/0126449 A1* | 5/2012 | Hart .................... B82Y 40/00 427/256 |
| 2017/0257974 A1* | 9/2017 | Cola ..................... C09K 5/063 |
| 2018/0108594 A1* | 4/2018 | Kondo .................. H01L 24/27 |
| 2018/0158753 A1* | 6/2018 | Iwai ...................... H01L 24/29 |
| 2019/0002284 A1* | 1/2019 | Inoue ................... B82Y 30/00 |
| 2019/0010376 A1* | 1/2019 | Inoue ................... B82Y 40/00 |
| 2021/0410319 A1* | 12/2021 | Manousakis ....... H05K 7/20309 |

OTHER PUBLICATIONS

"International Search Report & Written Opinion issued in PCT Application No. PCT/US22/013030", dated May 3, 2022, 11 Pages.

* cited by examiner

THERMALLY CONDUCTIVE MICROTUBES FOR EVENLY DISTRIBUTING HEAT FLUX ON A COOLING SYSTEM

CROSS-REFERENCE TO RELATED APPLICATIONS

N/A.

BACKGROUND

Computer cooling is the process of removing waste heat generated by system components within a computer system to keep components within permissible operating temperature limits. Cooling can be important because computer components may be optimized for operation below an operating temperature and/or may be susceptible to temporary malfunction or permanent failure if they are overheated.

A data center is a physical facility that is used to house computer systems and associated components. A data center typically includes a large number of computing devices (e.g., servers), which may be stacked in racks that are placed in rows. A colocation center is a type of data center where equipment, space, and network bandwidth are available for rental to customers.

A data center typically includes a cooling system to enable the computing devices within the data center to continue working within their specified thermal limits. Many computing devices use air for cooling system components requiring data centers to utilize air-based cooling techniques to transfer the heat to the external environment. Air has a low specific heat capacity requiring large amounts of air to remove a watt of heat. Air-based cooling techniques often require expensive infrastructure components such as computer room air conditioning (CRAC) units, air conditioner compressors, air circulation fans, duct work, air handlers, dehumidifiers, and the like.

One of the challenges in managing a data center is achieving the right balance between space and power. For various reasons, power density has increased considerably over the last few years. As server racks become more thermally dense requiring greater quantities of air for cooling, however, the costs and logistics of conventional cooling using air becomes increasingly challenging.

Some data centers utilize immersion cooling techniques in which computing devices are submerged in a thermally conductive, electrically isolating dielectric fluid, which may be referred to as a working fluid or a heat transfer fluid. In an immersion cooling system, at least one container (e.g., a tank) is filled with the working fluid, and computing devices are placed in the container. The container may be referred to herein as an immersion tank. The working fluid has a higher heat capacity than air requiring less fluid volume for a given heat load. Heat is removed from the computing devices by circulating the working fluid into direct contact with hot components, then through heat exchangers where the waste heat is transferred to ultimately be rejected to the external environment. Fluids suitable for immersion cooling have very good insulating properties to ensure that they can safely come into contact with energized electronic components without significantly altering the electrical characteristics of the system or system components. Immersion cooling has the potential to become a popular cooling solution for data centers because it allows operators to drastically reduce their energy usage through the elimination of the air cooling infrastructure.

Broadly speaking, there are two different types of immersion cooling techniques: single-phase immersion cooling and two-phase immersion cooling.

With a single-phase immersion cooling system, the working fluid never changes state and always remains in a liquid form. In some implementations, the working fluid may be actively circulated by pumping the dielectric coolant in, through, and around the computing devices being cooled, and then transferring the heat absorbed by the coolant to a heat rejection device such as a radiator, dry cooler, liquid-to-liquid heat exchanger, or cooling tower. Alternatively, the working fluid may be passively circulated by the natural convection of the heated coolant to the heat rejection device(s).

In a two-phase immersion cooling system, the heat of vaporization and the specific heat capacity characteristics of the work fluid are utilized for cooling. The working fluid generally has a relatively low boiling point such that heat absorbed by the fluid surrounding the computing devices causes a portion of the working fluid to boil off or vaporize into a gas, thereby enabling the phase change of the working fluid to carry heat away from the computing devices. The vapors produced by the boiling of the working fluid rise above the fluid pool where they contact a condenser that is cooler than the working fluid's boiling point. This causes the vapors to condense back into a liquid and fall back into the fluid pool.

To maintain a condenser at a suitable temperature, cool liquid may be pumped through the condenser. Thus, a two-phase immersion cooling system may also include one or more condenser pumps that are configured to pump cool liquid through the condenser(s) in the system.

Modern computing systems typically include one or more computing elements installed on a printed circuit board (PCB), forming a PCB assembly. One or more of the computing elements may be assembled as a die and connected to a PCB base, such as by soldering or other connection mechanism. A PCB assembly may include one or more "cores," or processors that are capable of working on different tasks, as well as any other computing element, such as memory, communication elements, any other circuitry, and combinations thereof. In some situations, a PCB assembly may include one or more application-specific integrated circuits (ASICs). ASICs often include customized combinations of circuitry on a PCB to optimally (and potentially exclusively) perform a specific task. By tailoring an ASIC to a specific task, the size of the chip may be reduced.

Each element on an PCB assembly may generate heat. However, different elements on a PCB assembly may not generate the same amount of heat during use. For example, in an ASIC having a CPU and a communication element, the CPU may generate more heat than the communication element. In some situations, the heat generated by the PCB assembly (either the entirety of the PCB assembly or a single computing element of the PCB assembly) may be greater than the cooling capacity of the cooling system. Put another way, the cooling system may not be able to maintain an operating temperature of one or more computing elements of the PCB assembly. For example, in the case of two-phase immersion cooling, the heat generated by the PCB assembly (or a single computing element of the PCB assembly) may boil away the working fluid faster than the working fluid is replaced against the PCB assembly. This may result in a "dry-out" condition, where there is no working fluid in contact with the computing elements to absorb heat. A dry-out condition may result in an increased operating temperature of the PCB assembly, which may lead to reduced performance and/or damage to elements of the PCB assembly.

To prevent dry-out conditions, a PCB assembly may include a heat spreader in contact with the cooling system (e.g., in contact with the working fluid of an immersion cooling system). A heat spreader may be a heat conducting plate that absorbs heat from the computing elements on a die and spreads it over a larger surface area. However, increasing the surface area over which the heat on the die is spread involves increasing the thickness of the heat spreader. Increasing the thickness of the heat spreader involves increasing the thermal resistance of the PCB assembly, resulting in higher operating temperatures of the PCB assembly. Thus, the use of a heat spreader may limit the amount of heat capable of being distributed from a PCB assembly.

The subject matter in the background section is intended to provide an overview of the overall context for the subject matter disclosed herein. The subject matter discussed in the background section should not be assumed to be prior art merely as a result of its mention in the background section. Similarly, a problem mentioned in the background section or associated with the subject matter of the background section should not be assumed to have been previously recognized in the prior art.

SUMMARY

In accordance with one aspect of the present disclosure, an electronics cooling system is disclosed that includes a printed circuit board (PCB) assembly including at least one heat generating component. The electronics cooling system also includes a cooling system including a heat plate. The electronics cooling system also includes a plurality of microtubes each having a first end and a second end. The first end is connected to the PCB assembly with a first spatial density and the second end being connected to the heat plate with a second spatial density.

The heat generating component may be a processor.

The cooling system may be a two-phase immersion cooling system.

The first spatial density may be greater than the second spatial density.

The plurality of microtubes may have a thermal conductivity that is higher than copper.

The plurality of microtubes may be formed from annealed pyrolytic graphite.

The heat plate may be a first heat plate and may be located on a first side of the PCB assembly. The system may further include a second heat plate located on a second side of the PCB assembly. At least a portion of the plurality of microtubes may be routed through the PCB assembly to the second heat plate.

The portion of the plurality of microtubes may be routed through a bore in a base of the PCB assembly.

At least a portion of the plurality of microtubes may be routed to a remote location.

In accordance with another aspect of the present disclosure, an electronics cooling system is disclosed that includes a printed circuit board (PCB) including a heat generating component and a cooling system including a heat plate. The electronics cooling system also includes a plurality of microtubes each having a first end and a second end. The first end is connected to the PCB and the second end is connected to the heat plate.

The cooling system may be a two-phase immersion cooling system.

The plurality of microtubes may be connected to the heat generating component with a first spatial density and to the heat plate with a second spatial density. The first spatial density may be greater than the second spatial density.

The plurality of microtubes may have a thermal conductivity that is higher than copper.

The plurality of microtubes may be formed from annealed pyrolytic graphite.

The PCB may include a first side and a second side opposite the first side. The heat generating component may be located on the first side and the heat plate may be located on the second side.

At least a portion of the plurality of microtubes may be routed to a remote location.

In accordance with another aspect of the present disclosure, an electronics cooling system is disclosed that includes a printed circuit board (PCB) assembly. The PCB assembly includes a base and a first heat generating component connected to the base. The first heat generating component has a first heat flux. The PCB assembly also includes a second heat generating component connected to the base. The second heat generating component has a second heat flux different from the first heat flux. The system also includes a cooling system including a heat plate. The system also includes a first plurality of thermally conductive microtubes extending from the first heat generating component to the heat plate. The first plurality of thermally conductive microtubes are connected to the first heat generating component with a first spatial density and the heat plate with a heat plate spatial density. The system also includes a second plurality of thermally conductive microtubes extending from the second heat generating component to the heat plate. The second plurality of thermally conductive microtubes are connected to the second heat generating component with a second spatial density and the heat plate with the heat plate spatial density.

The heat plate spatial density may be less than at least one of the first spatial density or the second spatial density.

The first heat generating component and the second heat generating component may be computing elements having a different intended use.

The PCB assembly may be a first PCB assembly. They system may further include a second PCB assembly between the first PCB assembly and the heat plate. At least a portion of the first plurality of thermally conductive microtubes may be routed through the first PCB assembly to the heat plate.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description that follows. Features and advantages of the disclosure may be realized and obtained by means of the systems and methods that are particularly pointed out in the appended claims. Features of the present disclosure will become more fully apparent from the following description and appended claims, or may be learned by the practice of the disclosed subject matter as set forth hereinafter.

BRIEF DESCRIPTION OF THE DRAWINGS

In order to describe the manner in which the above-recited and other features of the disclosure can be obtained, a more particular description will be rendered by reference to specific embodiments thereof which are illustrated in the appended drawings. For better understanding, the like elements have been designated by like reference numbers throughout the various accompanying figures. Understanding that the drawings depict some example embodiments, the embodiments will be described and explained with additional specificity and detail through the use of the accompanying drawings in which:

FIG. 3 is a representation of a side view of another electronics cooling assembly, according to at least one embodiment of the present disclosure;

DETAILED DESCRIPTION

Figure 1:
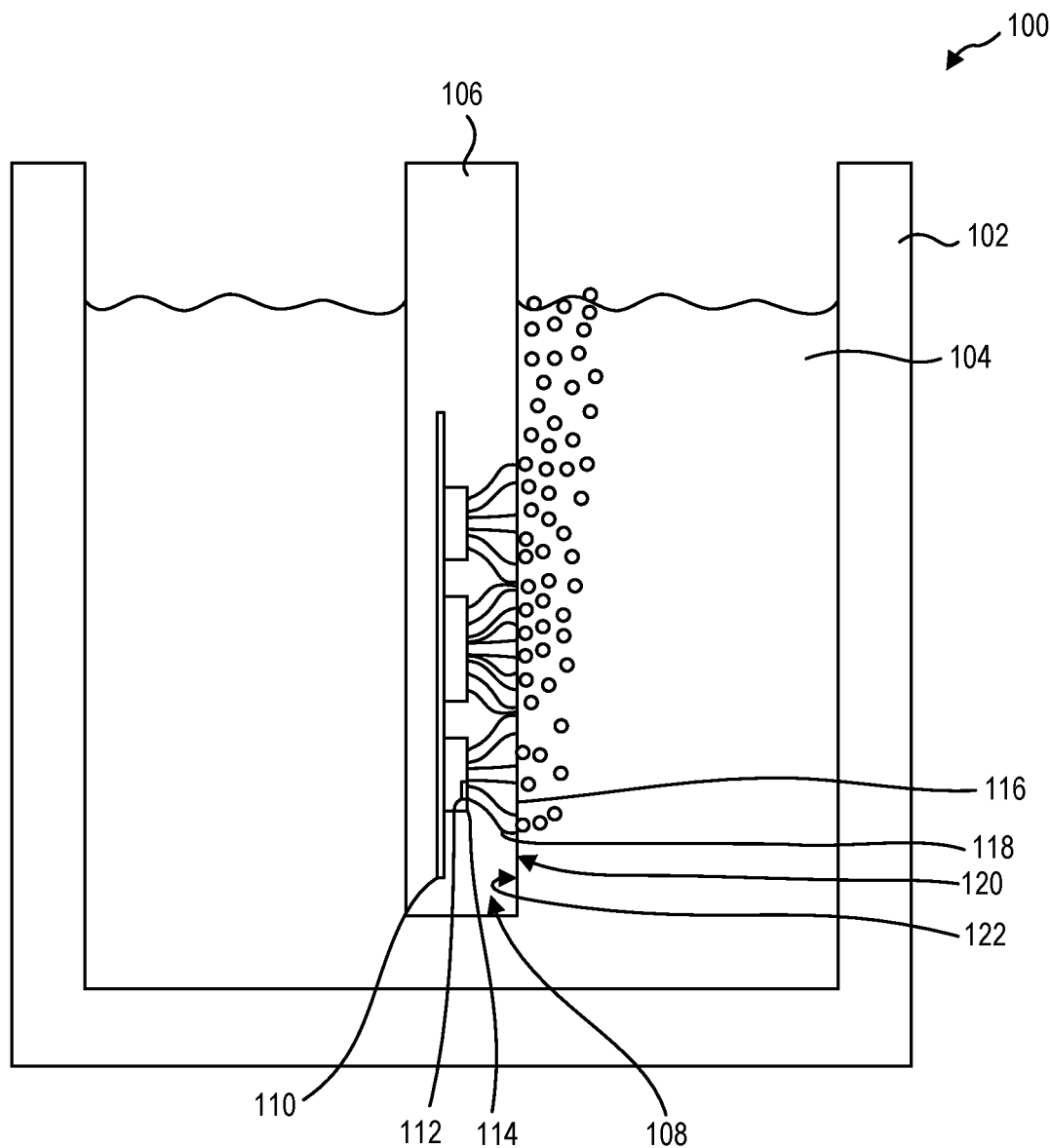
FIG. 1 is a representation of a two-phase immersion cooling system with a PCB assembly immersed in the working fluid, according to at least one embodiment of the present disclosure.

This application is related to cooling systems for computing devices. A printed circuit board (PCB) assembly is connected to a heat plate of a cooling system with thermally conductive microtubes. The thermally conductive microtubes are connected to the high-heat portions of the PCB assembly with a high spatial density. The thermally conductive microtubes are then connected to the heat plate with a lower spatial density. In this manner, the heat generated by the PCB assembly may be spread over the heat plate evenly. Evenly spreading the heat across the heat plate may decrease the thermal resistance between the PCB assembly and the cooling system. This may result in lower operating temperatures of the computing device, which may increase processing efficiency and/or increase the operating life of the computing elements on the PCB assembly.

The plurality of thermally conductive microtubes (generally microtubes) may be flexible and/or directable. In this manner, heat generated by a heat generating component of the PCB assembly may be directed away from the immediate vicinity of the heat generating component. This may allow the heat to be spread out over a larger area, thereby increasing the heat dispersal capabilities of the cooling system and reducing the chance of a localized dry-out. This may help to decrease the overall operating temperature of the PCB assembly, thereby improving the operating efficiency of the PCB assembly and/or reduce the chance of damage to elements of the PCB assembly.

Flexible and/or directable microtubes may direct heat from the PCB assembly to one or more remote locations. A remote location may be a heat plate and/or a location on a heat plate that is not directly opposite the heat generating component on the PCB assembly. For example, the microtubes may direct heat to one or more heat plates located on opposite sides of the PCB assembly. In some embodiments, the microtubes may allow for greater flexibility and/or density in the fabrication of computing systems. For example, the microtubes may allow multiple PCB assemblies to be stacked. The microtubes may be routed through the base of one or more stacked PCB assemblies (e.g., in the z-direction) to one or more heat plates. This may allow for a higher density of computing elements in a data center, thereby reducing floor space requirements.

In accordance with embodiments of the present disclosure, a PCB assembly may be a collection of computing elements connected to a base. The base may be a printed circuit board. Computing elements may be directly connected (e.g., soldered) to the printed circuit board. In some embodiments, a plurality of computing components may be formed as a die and connected to the printed circuit board. In some embodiments, a PCB assembly may be an application-specific integrated circuit (ASIC). In some embodiments, a PCB assembly may include multiple ASICs.

In accordance with embodiments of the present disclosure, a computing system may include one or more heat generating components. In some embodiments, the heat generating component may be a connected to (e.g., a computing element on) a PCB assembly. A heat generating component may be any component in a computing system that generates heat. Put another way, a heat generating component may be a means for generating heat. Examples of a heat generating component may include a processor, a power storage element (e.g., batteries, capacitors, supercapacitors), a central processing unit (CPU), a graphics processing unit (GPU), a vision processing unit (VPU), a communication relay, controllers, switches, relays, ports, memory (e.g., RAM, ROM), any other computing element, and combinations thereof. In some embodiments, a PCB assembly may include multiple heat generating components. For example, a PCB assembly may include multiple cores, or processors configured to operate separately.

In accordance with embodiments of the present disclosure, the thermal resistance of a PCB assembly is the raise in temperature across the PCB assembly to the working fluid based on the amount of heat generated by heat generating components on the PCB assembly. Elements impacting the thermal resistance include the distance from the PCB assembly to the working fluid, the thermal conductivity between the PCB assembly and the working fluid, and so forth.

In accordance with embodiments of the present disclosure, a cooling system is any system that is used to cool computing elements such as those that make up the PCB assembly. The cooling system may be an air cooled system, that uses air circulated over the PCB assembly to draw heat away. The cooling system may be a cold plate cooling system, where the PCB assembly is placed against a heat plate which has a cooling fluid circulating against the heat plate. The cooling system may be an immersion cooling system, where the PCB assembly is immersed in a dielectric working fluid that absorbs the heat generated by the PCB assembly. In some embodiments, the immersion cooling system may be a two-phase immersion cooling system. In a two-phase cooling system, the PCB assembly is immersed in a working fluid which has a relatively low boiling point. As the temperature of the PCB assembly rises, the heat generated by the heat generating components on the PCB assembly may cause the working fluid to change phases (e.g., boil). The boiling of the working fluid may absorb the generated heat, thereby cooling the PCB assembly. In a single-phase immersion cooling system, the PCB assembly is immersed in a working fluid which does not change phase. The fluid may be circulated across the PCB assembly to carry away the heat.

The cooling system has a cooling capacity. The cooling capacity may be the amount of heat flux (e.g., heat per unit area, W/cm$^2$) that the cooling system may absorb before becoming overwhelmed. When the cooling system becomes overwhelmed (e.g., when the heat flux against the cooling system is greater than the cooling capacity), the temperature of the computing elements may raise to a level that may cause a reduction in performance and/or damage the computing elements. In the case of a two-phase immersion cooling system, overwhelming the cooling system may result in a dry-out condition, where the working fluid is boiled away faster than it can be replaced. In some embodiments, the cooling capacity may be 300 W/cm$^2$, 350 W/cm$^2$, 400 W/cm$^2$, or any value therebetween. In some embodiments, the cooling capacity may be based on the heat capacity of the working fluid.

The cooling system includes a heat plate. A heat plate may be any structure that conveys heat to the cooling system. The heat plate may be in direct contact with the cooling media. For example, the heat plate may be in direct contact with the working fluid of an immersion cooling system. In some examples, the heat plate may be in contact with or part of a housing for a cold plate cooling system. In some examples, the heat plate may be exposed to circulating air in an air cooled cooling system. In some embodiments, the heat plate may be formed from a thermally conductive material. For example, the heat plate may be formed from a thermally conductive metal, such as copper. In some examples, the heat plate may be formed from a carbon-based material, such as a graphite plate, graphene, diamond, or other carbon-based material. In some examples, the heat plate may be formed from any thermally conductive material or combination of thermally conductive materials.

In accordance with embodiments of the present disclosure, a thermally conductive microtube (hereinafter microtube) may be any structure that conveys heat from the PCB assembly to a cooling system. In some embodiments, a microtube may be formed from a high thermally conductive material. In some embodiments, the microtube may be formed from any material, such as graphite, pyrolytic graphite, annealed pyrolytic graphite, graphene, carbon nanotubes, diamond, metals, metal alloys, any other material, and combinations thereof. In some embodiments, a microtube may be formed and/or extruded as a single unit. In some embodiments, a microtube may be layered or stacked from a plurality of smaller elements. In some embodiments, a microtube may be formed through additive manufacturing.

Conventionally, a heat spreader or other thermal management device used to transfer heat between the PCB assembly and the cooling system is formed from copper. In some embodiments, microtubes of the present disclosure may be formed from any material that is more thermally conductive than copper. In some embodiments, the microtubes may have a thermal conductivity in a range having an upper value, a lower value, or upper and lower values including any of 385 W/m K, 400 W/m K, 425 W/m K, 450 W/m K, 475 W/m K, 500 W/m K, 525 W/m K, 550 W/m K, 575 W/m K, 600 W/m K, 650 W/m K, 700 W/m K, 750 W/m K, 800 W/m K, or any value therebetween. For example, the thermal conductivity may be greater than 385 W/m K. In another example, the thermal conductivity may be less than 800 W/m K. In yet other examples, the thermal conductivity may be any value in a range between 385 W/m K and 800 W/m K. In some embodiments, it may be critical that the thermal conductivity is greater than 385 W/m K to effectively spread the heat generated by the PCB assembly.

In accordance with embodiments of the present disclosure, a microtube may have any shape. For example, a microtube may be tubular (e.g., have a circular or ovoid lateral cross-sectional shape). In some examples, a microtube may be prismatic, with a lateral cross-sectional shape of a square, a rectangle, a triangle, a pentagon, a hexagon, a heptagon, an octagon, a nonagon, a decagon, a polygon having any number of sides, a non-polygon, semicircular, any other shape, and combinations thereof.

In accordance with embodiments of the present disclosure, heat flux is the flow of heat energy (e.g., Watts) over a given area (e.g., square millimeters or square centimeters). A PCB assembly may have an average heat flux, which is the total amount of heat generated over the entire area of the PCB assembly. The average heat flux of the PCB assembly may include the average of several local heat fluxes. A local heat flux may be the heat flux for heat generated by the heat generating component over the area that the heat generating component occupies.

FIG. 1 is a representation of an electronics cooling system 100 set up for two-phase immersion cooling, according to at least one embodiment of the present disclosure. The electronics cooling system 100 includes an immersion tank 102 at least partially filled with a working fluid 104. A PCB support 106 may be inserted into the working fluid 104. The PCB support 106 may house a PCB assembly 108. The PCB assembly 108 shown includes a base 110 and one or more heat generating components 112 installed on a die 114.

The heat generating components 112 may be connected to a heat plate 116 via a plurality of microtubes 118. The microtubes 118 may transfer heat generated by the heat generating components 112 to the heat plate 116. When the temperature of the heat plate 116 raises to above the boiling point of the working fluid 104, the working fluid 104 may begin to boil.

In some embodiments, the microtubes 118 may spread the heat from the heat generating components 112 across a greater surface area on the heat plate 116. In some embodiments, the microtubes 118 may evenly spread the heat across the heat plate 116. Evenly spreading the heat across the heat plate 116 may help to reduce high concentrations of heat on the heat plate 116. Put another way, evenly spreading the heat across the heat plate 116 may reduce the temperature of any hot spots on the heat plate 116. This may help to prevent a dry-out condition on the heat plate 116. In this manner, the heat removal capacity of the electronics cooling system 100 may be increased.

In some embodiments, the microtubes 118 may be connected to a dry side 122 of the heat plate 116 (e.g., the side of the heat plate 116 facing the PCB assembly 108). In some embodiments, the microtubes 118 may be directly connected to the heat plate 116. In some embodiments, the microtubes 118 may be connected to the heat plate 116 through another element, such as a heat spreader or other element.

In some embodiments, a wet side 120 of the heat plate 116 may directly contact the working fluid 104 (e.g., the side of the heat plate in contact with the working fluid 104). In some embodiments, the wet side 120 may be coated with a boiler enhancement coating. A boiler enhancement coating may be applied to the wet side 120 of the heat plate 116 to help promote or facilitate boiling (e.g., phase change) of the working fluid 104.

As may be seen in FIG. 1, the microtubes 118 may be routed to a remote location on the heat plate 116 that is remote from (e.g., not directly opposite) the heat generating component 112. By routing the microtubes 118 to a remote location, heat from the heat generating components 112 may be diverted away from the heat generating component 112. In some embodiments, the microtubes 118 may include one or more bends between the heat generating components 112 and the heat plate 116. Including the bends in the microtubes 118 may provide room to route the microtubes 118 to the heat plate 116.

Figure 2:
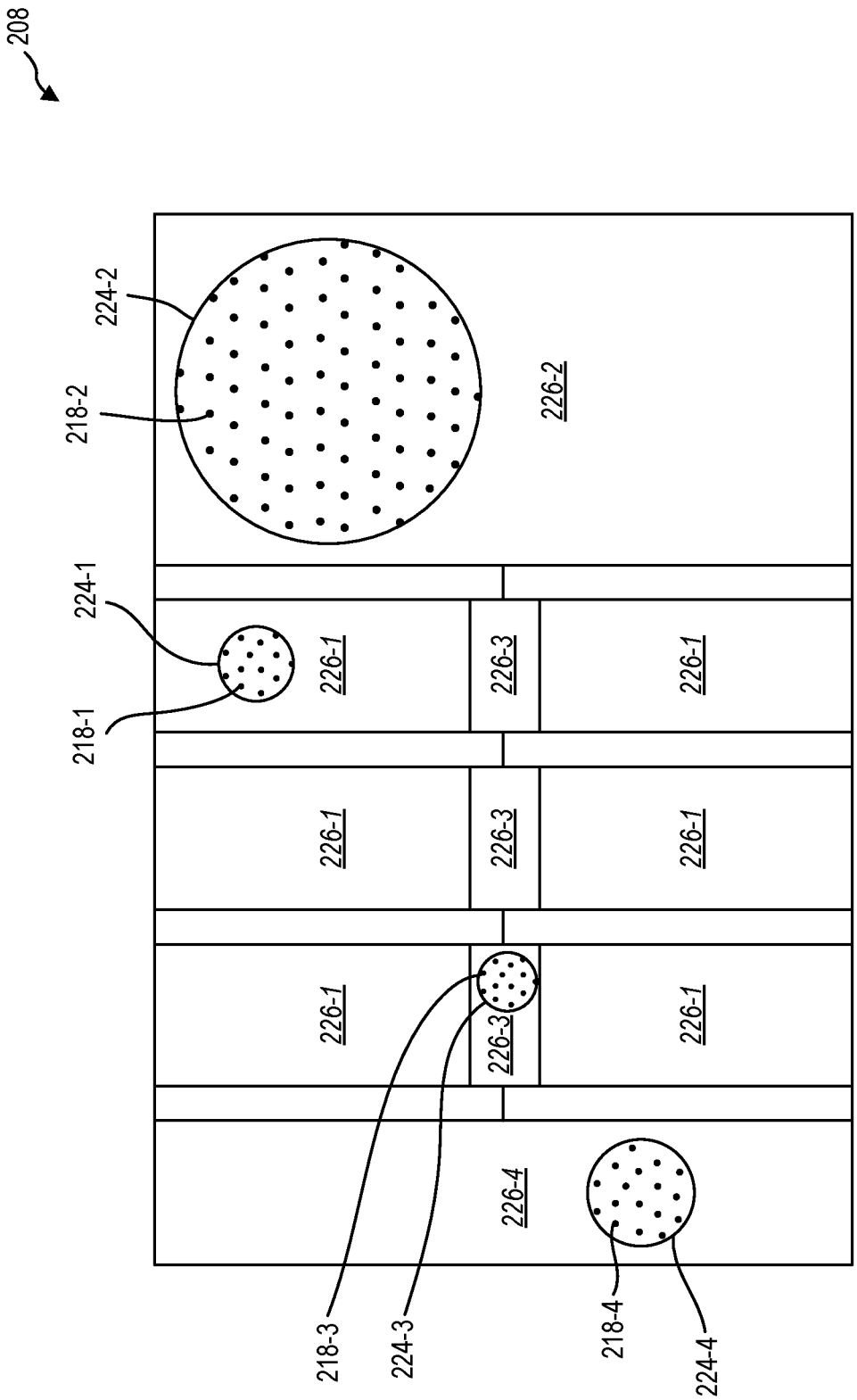
FIG. 2 is a representation of a top view of a PCB assembly, according to at least one embodiment of the present disclosure.

FIG. 2 is a top-down schematic representation of a PCB assembly 208 including different heat zones (collectively 224), according to at least one embodiment of the present disclosure. The PCB assembly 208 shown may include many different areas or zones that include different computing elements (collectively 226). For example, the PCB assembly may be a multi-core computing device, and include several core computing components 226-1, memory computing components 226-2, connection computing components 226-3, system agent computing components 226-4, and any other computing component 226.

While the heat zones 224 are shown schematically as discrete circles on the computing components 226, it should be understood that the heat zones 224 may cover the entirety of a computing component 226. Furthermore, while the heat zones 224 may be discussed herein as having a single heat flux across the heat zone 224, it should be understood that the heat flux across a heat zone may vary, depending on the layout and utilization of processors and other elements within the computing component 226. Similarly, it should be understood that the transition between heat zones (and therefore, the transition between heat fluxes) between two computing components 226 may occur gradually, or over a gradient. Similarly, the connection of microtubes to the PCB assembly 208, as discussed herein, may change in spatial density between heat zones 224 may occur gradually to match the heat flux gradient or for any other reason.

During operation, each of the computing components 226 may generate heat.

The heat generation over the entire area of the PCB assembly 208 is the average heat flux. In some embodiments, the average heat flux may be in a range having an upper value, a lower value, or upper and lower values including any of 50 W/cm$^2$, 100 W/cm$^2$, 150 W/cm$^2$, 200 W/cm$^2$, 250 W/cm$^2$, 300 W/cm$^2$, 350 W/cm$^2$, 400 W/cm$^2$, or any value therebetween. For example, the average heat flux may be greater than 50 W/cm$^2$. In another example, the average heat flux may be less than 400 W/cm$^2$. In yet other examples, the average heat flux may be any value in a range between 400 W/cm$^2$. In some embodiments, it may be critical that the average heat flux is less than 400 W/cm$^2$ so that the average heat flux does not overwhelm the cooling system.

In some embodiments, the cooling system (e.g., the electronics cooling system 100 of FIG. 1) may be able to handle the average heat flux of the PCB assembly 208 (e.g., the cooling system may be able to absorb the total amount of heat generated by the PCB assembly 208 over the entire area of the PCB assembly 208 without creating a dry-out condition). However, different computing components 226 may generate a different amount of heat, resulting in one or more local heat fluxes in different heat zones 224 that are different than the average heat flux for the PCB assembly 208. In some embodiments, one or more local heat fluxes may be greater than the average heat flux. In some embodiments, while the average heat flux of the PCB assembly 208 may be absorbed by the cooling system, a local heat flux on the PCB assembly 208 may overwhelm the cooling system at the location of the local heat flux (e.g., create a dry-out condition), while the cooling system in other areas of the PCB assembly 208 is under-utilized (e.g., the working fluid may not boil or may boil less vigorously). In some embodiments, one or more local heat fluxes may be less than the average heat flux.

In the embodiment shown in FIG. 2, the core computing components 226-1 may generate heat in a first heat zone 224-1 having a first local heat flux. The memory computing components 226-2 may generate heat in a second heat zone 224-2 having a second local heat flux. In some embodiments, the first local heat flux in the first heat zone 224-1 may be different than the second local heat flux in the second heat zone 224-2.

The difference in local heat flux between the first heat zone 224-1 and the second heat zone 224-2 may be hardware based. The hardware of the different computing components 226 may generate different levels of heat. For example, in some embodiments, the core computing components 226-1 may generate more heat than the memory computing components 226-2. In some embodiments, the first heat zone 224-1 generated by the core computing components 226-1 may have a local heat flux that is greater than the average heat flux of the PCB assembly. In some embodiments, the local heat flux of the first heat zone 224-1 is greater than can be cooled by the cooling system (e.g., the local heat flux may overwhelm the cooling system). For example, in the two-phase cooling system shown in FIG. 1, the first local heat flux in first heat zone 224-1 may generate a dry-out condition such that the working fluid is boiled away faster than it can be replaced.

In some embodiments, a first plurality of microtubes 218-1 may be connected to the PCB assembly 208 in the first heat zone 224-1 to divert the heat away to a heat plate (e.g., the heat plate 116 of FIG. 1). In some embodiment, the first plurality of microtubes 218-1 may be connected to the PCB assembly 208 with a first spatial density in the first heat zone 224-1. The first plurality of microtubes 218 may then be routed to the heat plate to disperse the heat using the cooling system. In some embodiments, the first plurality of microtubes 218-1 may be connected to the heat plate with a different spatial density than that with which they are connected to the PCB assembly 208 in the first heat zone 224-1. For example, the first plurality of microtubes may be connected to the heat plate with a spatial density that is lower than the first density. This may spread heat generated by the core computing components 226-1 across a greater surface area. In this manner, the local heat flux caused by the core computing components 226-1 may be reduced to a heat plate heat flux that is less than the local heat flux at the first heat zone 224-1. In some embodiments, the heat plate heat flux may be within the cooling capacity of the cooling system (e.g., does not create a dry-out condition).

In some embodiments, the local heat flux may be in a range having an upper value, a lower value, or upper and lower values including any of 250 W/cm$^2$, 300 W/cm$^2$, 350 W/cm$^2$, 400 W/cm$^2$, 450 W/cm$^2$, 500 W/cm$^2$, 550 W/cm$^2$, 600 W/cm$^2$, 650 W/cm$^2$, 700 W/cm$^2$, 750 W/cm$^2$, 800 W/cm$^2$, or any value therebetween. For example, the local heat flux may be greater than 250 W/cm$^2$. In another example, the local heat flux may be less than 800 W/cm$^2$. In yet other examples, the local heat flux may be any value in a range between 250 W/cm$^2$ and 800 W/cm$^2$.

Each microtube (collectively 218) has a microtube diameter (assuming a circular cross-sectional shape). In some embodiments, the microtube diameter may be in a range having an upper value, a lower value, or upper and lower values including any of 1 μm, 2 μm, 3 μm, 4 μm, 5 μm, 7 μm, 10 μm, 15 μm, 20 μm, 25 μm, 30 μm, 40 μm, 50 μm, 100 μm, or any value therebetween. For example, the microtube diameter may be greater than 1 μm. In another example, the microtube diameter may be less than 100 μm. In yet other examples, the microtube diameter may be any value in a range between 1 μm and 100 μm. In some embodiments, it may be critical that the microtube diameter is less than 10 μm to fit and be routed between the PCB assembly 208 and the heat plate.

In some embodiments, each microtube (collectively 218) may have a microtube heat flux, which is the amount of heat conveyed by a single microtube 218. In some embodiments, the microtube heat flux may be in a range having an upper value, a lower value, or upper and lower values including any of 400 W/cm$^2$, 450 W/cm$^2$, 500 W/cm$^2$, 550 W/cm$^2$, 600 W/cm$^2$, 650 W/cm$^2$, 700 W/cm$^2$, 750 W/cm$^2$, 800 W/cm$^2$, 850 W/cm$^2$, 900 W/cm$^2$, 950 W/cm$^2$, 1,000 W/cm$^2$, or any value therebetween. For example, the microtube heat flux may be greater than 400 W/cm$^2$. In another example, the microtube heat flux may be less than 1,000 W/cm$^2$. In yet other examples, the microtube heat flux may be any value in a range between 400 W/cm$^2$ and 1,000 W/cm$^2$. In some embodiments, it may be critical that the microtube heat flux is greater than 750 W/cm$^2$ to maintain the PCB assembly 208 at or below the operating temperature.

Based on the heat flux and the microtube diameter, each microtube 218 may have a heat transfer capacity, which may be the amount of heat energy (e.g., watts) that the microtube 218, based on the microtube diameter. In some embodiments, the heat transfer capacity may be in a range having an upper value, a lower value, or upper and lower values including any of 1 milliwatts (mW), 5 mW, 10 mW, 25 mW, 50 mW, 75 mW, 100 mW, 175 mW, 250 mW, 500 mW, 1 W, or any value therebetween. For example, the heat transfer capacity may be greater than 1 mW. In another example, the heat transfer capacity may be less than 1 W. In yet other examples, the heat transfer capacity may be any value in a range between 1 mW and 1 W. In some embodiments, it may be critical that the heat transfer capacity is greater than 10 mW to sufficiently route heat away from the PCB assembly to the heat plate.

In some embodiments, the heat plate may have the same surface area as the PCB assembly 208. The microtubes 218 may be connected to the heat plate with an even spatial density across the entire surface area of the heat plate. This may help to spread the entirety of the heat generated by the PCB assembly 208 evenly across the heat plate. In some embodiments, the spatial density of the microtubes 218 at a specific computing component may be determined based on the heat transfer capacity and the heat flux of a computing component 226. For example, if a computing component 226 generates 2 W of heat, and the heat transfer capacity of a single microtube 218 is 100 mW, then at least 20 microtubes 218 need to be connected to the computing component 226 to transfer the heat from the computing component 226 to the heat plate.

As discussed herein, different heat zones 224 may have different local heat fluxes. For example, the second heat zone 224-2 associated with the memory computing components 226-2 may have a lower heat flux than first heat flux at the first heat zone 224-1 associated with the core computing components 226-1. Because there is less heat to dissipate, a second plurality of microtubes 218-2 may be connected to the PCB assembly 208 at the memory computing component 226-2 with a second spatial density. The second spatial density may be different from the first spatial density of the first plurality of microtubes 218-1. In the embodiment shown, the second spatial density of the second plurality of microtubes 218-2 is less than the first spatial density of the first plurality of microtubes 218-1.

In some embodiments, the second heat flux at the second heat zone 224-2 associated with the memory computing components 226-2 may be less than the average heat flux of the PCB assembly 208. In some embodiments, the second heat flux may be the same as the average heat flux. In some embodiments, the second heat flux may be greater than the average heat flux, but less than the first heat flux at the first heat zone 224-1. In some embodiments, the second heat flux may overwhelm the cooling system, and the second plurality of microtubes 218-2 may be connected to the heat plate with a spatial density that is less than the second spatial density in the second heat zone 224-2.

In some embodiments, the second heat flux may be equal to the cooling capacity of the cooling system. In this case, the spatial density of the second plurality of microtubes 218-2 at the heat plate may be the same as (or less than, if desired) the second spatial density. In some embodiments, the second heat flux may be less than the cooling capacity of the cooling system. In this case, the spatial density of the second plurality of microtubes 218-2 at the heat plate may be greater than the second spatial density. Increasing the spatial density of the second plurality of microtubes at the heat plate may make room on the heat plate for microtubes connected to portions of the PCB assembly 208 having a higher heat flux, such as the first plurality of microtubes 218-1 connected to the core computing component 226-1. This may allow the excess heat generated by the core computing component 226-1 to be dispersed over a larger area. In some embodiments, this may allow for an even distribution of heat flux across the entirety of the heat plate associated with the PCB assembly.

In some embodiments, each computing component 226 or other section of the PCB assembly 208 may include a heat zone 224. For example, the connection computing components 226-3 may include a third heat zone 224-3 and the system agent computing components 226-4 may include a fourth heat zone 224-4. A third plurality of microtubes 218-3 may be connected to the connection computing components 226-3 with a third spatial density and a fourth plurality of microtubes 218-4 may be connected to the system agent computing components 226-4 with a fourth spatial density. In some embodiments, each heat zone 224 may have a different heat flux. In some embodiments, one or more (including all) of the first plurality of microtubes 218-1, the second plurality of microtubes 218-2, the third plurality of microtubes 218-3, and the fourth plurality of microtubes 218-4 may be the same. In some embodiments, one or more (including all) of the first plurality of microtubes 218-1, the second plurality of microtubes 218-2, the third plurality of microtubes 218-3, and the fourth plurality of microtubes 218-4 may be different.

In some embodiments, different computing components 226 of the same type may have different heat fluxes depending on their utilization. For example, different core computing components 226-1 may have different heat fluxes depending on their utilization. In some embodiments, the first plurality of microtubes 218-1 may be connected to the core computing components 226-1 with a first spatial density that is based on the maximum heat flux generated by the core computing components 226-1. In some embodiments, the first plurality of microtubes 218-1 may be connected to the core computing components 226-1 based on intended use of each core. For example, different cores on a PCB assembly 208 may be assigned different tasks (e.g., have different intended uses). A first core may be assigned to memory management (e.g., data storage and retrieval), and a second core may be assigned to a client interface (e.g., GUI interaction). Each core may have a different utilization, which affects the heat generation of that core, with a higher utilization resulting in a higher heat generation of the core. In some embodiments, first plurality of microtubes 218-1 may connect to different cores with a different spatial density, based on the anticipated use (and therefore the anticipated heat flux) of a given core. Thus, an operator may customize the heat dissipating capacity based on the intended use of the PCB assembly 208. This may increase the flexibility of the design of the PCB assembly 208. In some embodiments, customizing the spatial density of the microtubes connected to the PCB assembly 208 may help to optimize performance of the PCB assembly 208 and reduce client costs.

Figure 3:
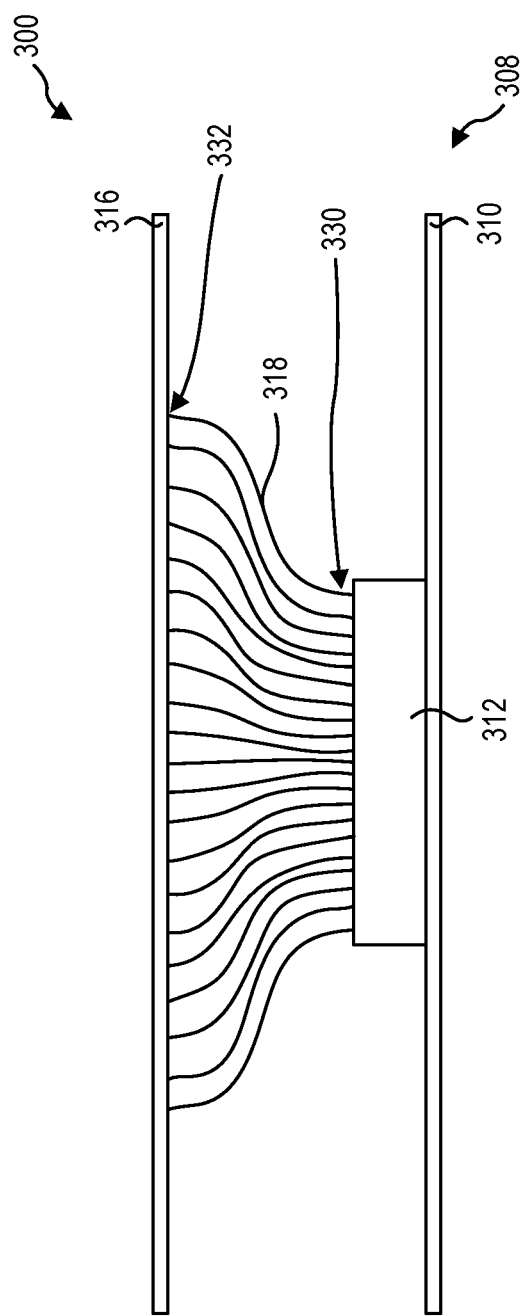
FIG. 3 is a representation of a side view of an electronics cooling assembly, according to at least one embodiment of the present disclosure.

FIG. 3 is a representation of a side view of an electronics cooling system 300, according to at least one embodiment of the present disclosure. The electronics cooling system 300 includes a PCB assembly 308 having a heat generating component 312 connected to a base 310. A plurality of microtubes 318 may be connected to the PCB assembly 308 at a first end 330. In the embodiment shown, the microtubes 318 are connected to the heat generating component 312. However, it should be understood that the microtubes 318 may be connected to the base 310.

In some embodiments, the PCB assembly 308 (including the base 310 and the heat generating component 312) may be coated with a thermally conductive epoxy to protect the elements of the PCB assembly 308. In some embodiments, the microtubes 318 may be connected to the thermally conductive epoxy coating the PCB assembly 308. For example, the microtubes 318 may be connected to the thermally conductive epoxy coating with an adhesive. In some embodiments, the microtubes 318 may be embedded within the thermally conductive epoxy coating. In some embodiments, the microtubes 318 may be connected to the PCB assembly 308 with an adhesive prior to application of the epoxy to the PCB assembly 308. In some embodiments, the microtubes 318 may be additively manufactured on top of the PCB assembly 308 and/or the epoxy on the PCB assembly 308.

In the embodiment shown, the microtubes 318 are connected to the heat plate 316 at a second end 332. In some embodiments, the microtubes 318 may be embedded to a thermally conductive epoxy coating the heat plate 316. In some embodiments, the microtubes 318 may be connected to the heat plate 316 with an adhesive.

In the embodiment shown, the microtubes 318 are connected to the PCB assembly with a first spatial density. The microtubes 318 are connected to the heat plate 316 with a second spatial density that is less than the first spatial density. In the embodiment shown, at least a portion of the microtubes 318 are connected to a portion of the heat plate 316 that is opposite the heat generating component 312. Furthermore, at least a portion of the microtubes 318 are connected to a portion of the heat plate 316 that is remote from (e.g., not opposite to) the heat generating component 312. Routing at least a portion of the microtubes 318 to location on the heat plate 316 remote from the heat generating component may help to spread the heat from the heat generating component 312 over a larger area, thereby reducing the heat flux from the heat generating component 312 at the heat plate 316.

In the embodiment shown, the microtubes 318 may include one or more bends as they are routed between the heat generating component 312 and the heat plate 316. One or more bends may help to make room for each of the microtubes 318 to be connected to the heat generating component 312 and/or the heat plate 316. In some embodiments, the microtubes 318 may extend straight between the heat generating component 312 and the heat plate 316.

Figure 4:
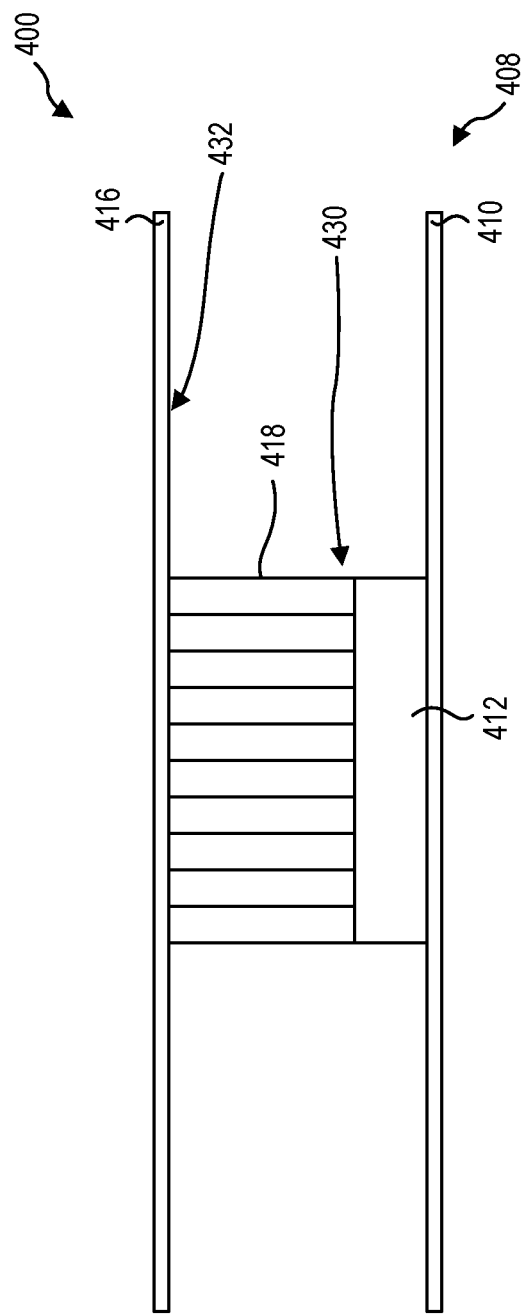
FIG. 4 is a representation of a side view of yet another electronics cooling assembly, according to at least one embodiment of the present disclosure.

FIG. 4 is a representation of a side view of an electronics cooling system 400, according to at least one embodiment of the present disclosure. The electronics cooling system 400 includes a PCB assembly 408 having a heat generating component 412 connected to a base 410. A plurality of microtubes 418 may extend between the PCB assembly 408 at a first end 430 and a heat plate 416 at a second end 432.

In the embodiment shown, the heat flux of the heat generating component 412 may be less than or equal to the cooling capacity of the cooling system. The spatial density of the connections of the plurality of microtubes 418 to the PCB assembly 408 may be the same as the spatial density of the connections of the plurality of microtubes 418 to the heat plate 416. Thus, the first end 430 may be directly across from the second end 432 between the PCB assembly 408 and the heat plate 416. Furthermore, the microtubes 418 may extend straight between the PCB assembly 408 and the heat plate 416.

Figure 5:
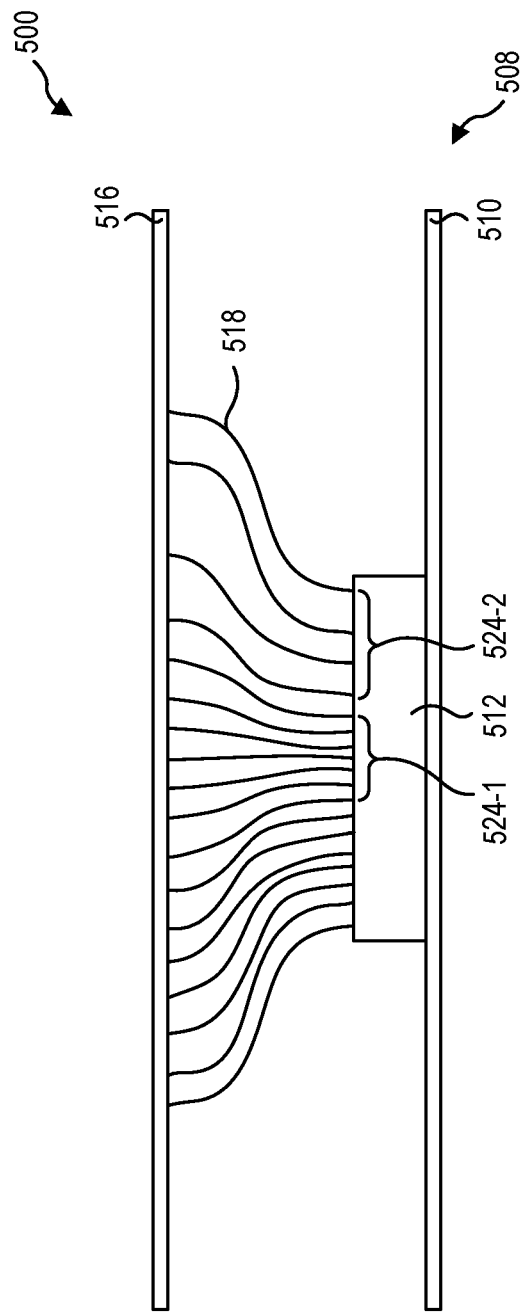
FIG. 5 is a representation of a side view of still another electronics cooling assembly, according to at least one embodiment of the present disclosure.

FIG. 5 is a representation of a side view of an electronics cooling system 500, according to at least one embodiment of the present disclosure. The electronics cooling system 500 includes a PCB assembly 508 having a heat generating component 512 connected to a base 510. A plurality of microtubes 518 may extend between the PCB assembly 508 and the heat plate 516.

In the embodiment shown, the plurality of microtubes 518 are connected to the heat generating component 512 with different spatial densities. In some embodiments, the heat generating component 512 may include a first heat zone 524-1 having a first heat flux and a second heat zone 524-2 having a second heat flux. The first heat flux may be greater than the second heat flux. The plurality of microtubes may be connected to the heat generating component 512 at the first heat zone 524-1 with a first spatial density and at the second heat zone 524-2 with a second spatial density. Because the first heat flux at the first heat zone 524-1 is greater than the second heat flux at the second heat zone 524-2, the first spatial density may be greater than the second spatial density.

In some embodiments, all of the plurality of microtubes 318 may be connected to the heat plate 516 with a third spatial density. For example, the plurality of microtubes 318 that extend from the first heat zone 524-1 to the heat plate 516 may be connected to the heat plate 516 with the third spatial density. Similarly, the plurality of microtubes 318 that extend from the second heat zone 524-2 to the heat plate 516 may be connected to the heat plate 516 with the third spatial density (e.g., the same spatial density). In this manner, heat may be spread across the heat plate 516 evenly or approximately evenly, regardless of any change in heat flux between the first heat zone 524-1 and the second heat zone 524-2. This may help to reduce or eliminate areas of high local heat flux (e.g., hot spots) on the heat plate 516 that are greater than the cooling capacity of the cooling system (e.g., that may overwhelm the cooling system). This may further reduce or eliminate the chance of a dry-out condition, thereby increasing the effectiveness of the electronics cooling system 500.

Figure 6:
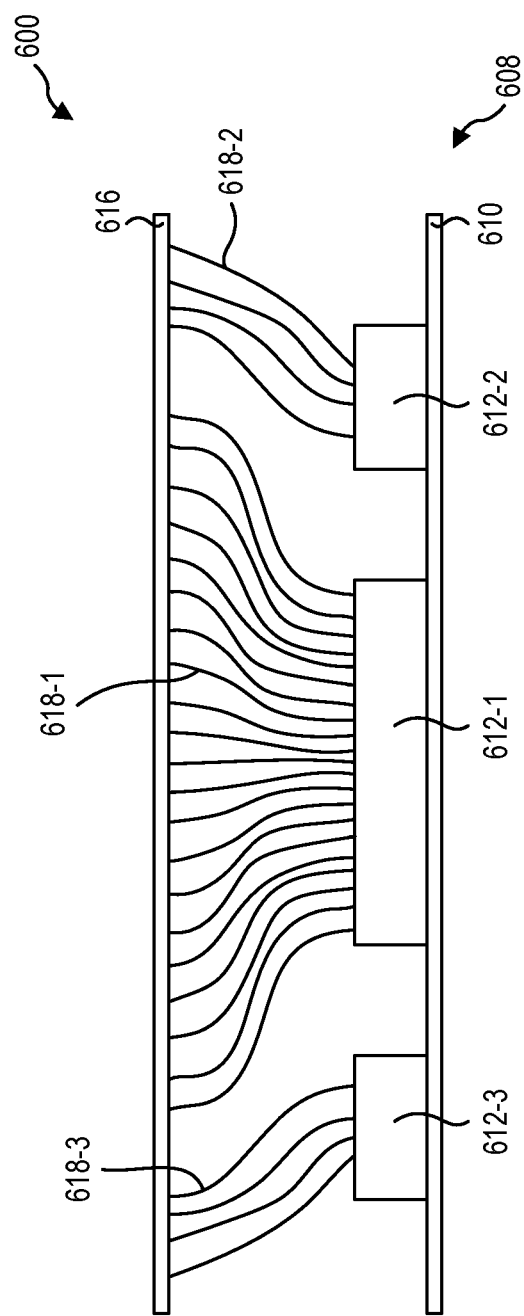
FIG. 6 is a representation of a side view of a further electronics cooling assembly, according to at least one embodiment of the present disclosure.

FIG. 6 is a representation of a side-view of an electronics cooling system 600, according to at least one embodiment of the present disclosure. The electronics cooling system 600 includes a PCB assembly 608 including a base 610. The PCB assembly 608 has a first heat generating component 612-1 having a first heat flux, a second heat generating component 612-2 having a second heat flux, and a third heat generating component 612-3 having a third heat flux. A first plurality of microtubes 618-1 extends between the first heat generating component 612-1 and a heat plate 616. A second plurality of microtubes 618-2 extends between the second heat generating component 612-2 and the heat plate 616. A third plurality of microtubes 618-3 extends between the third heat generating component 612-3 and the heat plate 616.

Based on their respective heat fluxes, the first, second, and third plurality of microtubes 618-1, 618-2, 618-3 may be connected to their respective heat generating components 612-1, 612-2, 612-3 with different spatial densities. In the embodiment shown, the first heat flux is greater than the second heat flux and the third heat flux. To transfer the larger amount of heat from the first heat flux, the first plurality of microtubes 618-1 may be connected to the first heat generating component 612-1 with a larger spatial density than the spatial density of the connections between the second plurality of microtubes 618-2 and the second heat generating component 612-2 and the spatial density of the connections between the third plurality of microtubes 618-3 and the third heat generating component 612-3.

To evenly spread the heat generated by the first, second, and third heat generating components 612-1, 612-2, 612-3 across the heat plate 616, the first, second, and third plurality of microtubes 618-1, 618-2, 618-3 may be connected to the heat plate with a heat plate spatial density that is the same for the first, second, and third plurality of microtubes 618-1, 618-2, 618-3. This may help to reduce and/or eliminate local instances of heat flux on the heat plate 616 that are greater than the cooling capacity of the heat plate 616.

Figure 7:
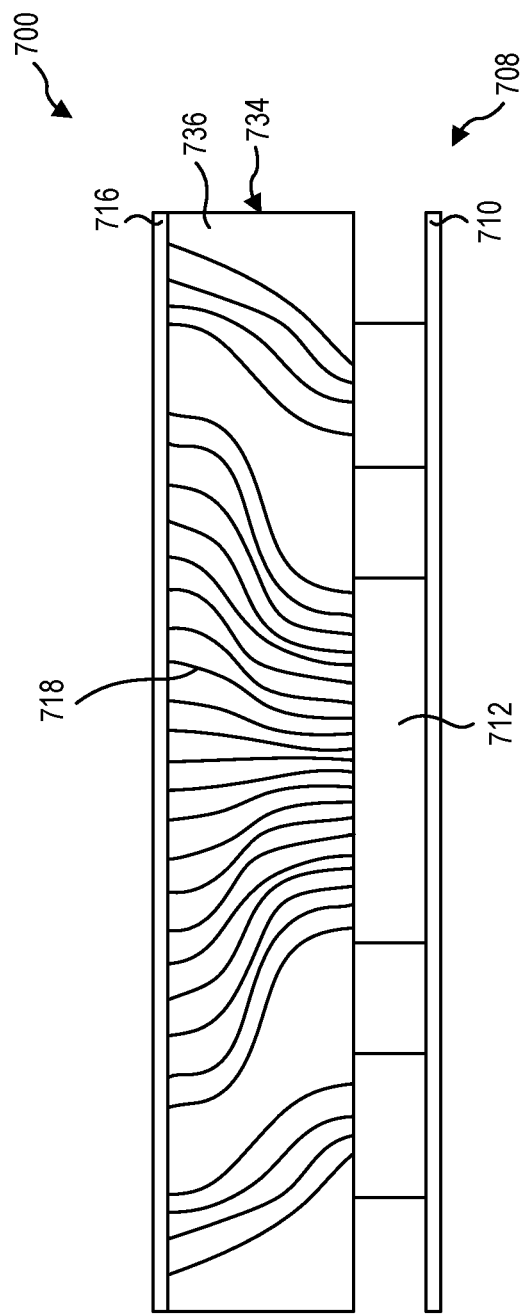
FIG. 7 is a representation of a side view of yet a further electronics cooling assembly, according to at least one embodiment of the present disclosure.

FIG. 7 is a representation of a side view of an electronics cooling system 700, according to at least one embodiment of the present disclosure. The electronics cooling system 700 includes a PCB assembly 708 having a heat generating component 712 connected to a base 710. A plurality of microtubes 718 may extend between the PCB assembly 708 and a heat plate 716.

The PCB assembly 708 and the heat plate 716 define a space 734 between them. The microtubes 718 extend through the space 734. In some embodiments, the space 734 may be empty. Put another way, the space 734 may be filled with air or a vacuum, or another low thermal conductivity element. In some embodiments, the space 734 may be filled with a spacer 736. In some embodiments, the spacer 736 may help to support the heat plate 716 and/or the PCB assembly 708 from damage due to bumps, jostles, or other movement.

In some embodiments, the microtubes 718 may be embedded in and/or extend through the spacer 736. The spacer 736 and microtube 718 assembly may be pre-fabricated and later inserted into the space 734 between the PCB assembly 708 and the heat plate 716. By placing the microtubes 718 in pre-determined locations, the spacer 736 and microtube 718 assembly may include a spatial density of the microtubes 718 that correlates with each section of the electronics cooling system 700. For example, the microtubes 718 that will be in contact with the heat generating component 712 may be spaced with a high spatial density at the heat generating component 712 and with a low spatial density at the heat plate 716. Pre-assembling the spacer 736 with the microtubes 718 may improve the ease of manufacturing.

In some embodiments, the spacer 736 may be formed from a thermally conductive material. For example, the spacer 736 may be formed from a metal, such as copper and/or indium. In some embodiments, the spacer 736 may be formed from a carbon based material. In some embodiments, the spacer 736 may have a lower thermal conductivity than the microtubes 718 so that the microtubes 718 may preferentially conduct heat from the heat generating component 712 to specific locations on the heat plate 716 without creating high local heat fluxes. In some embodiments, the spacer 736 may be formed from a low thermally conductive material.

Figure 8:
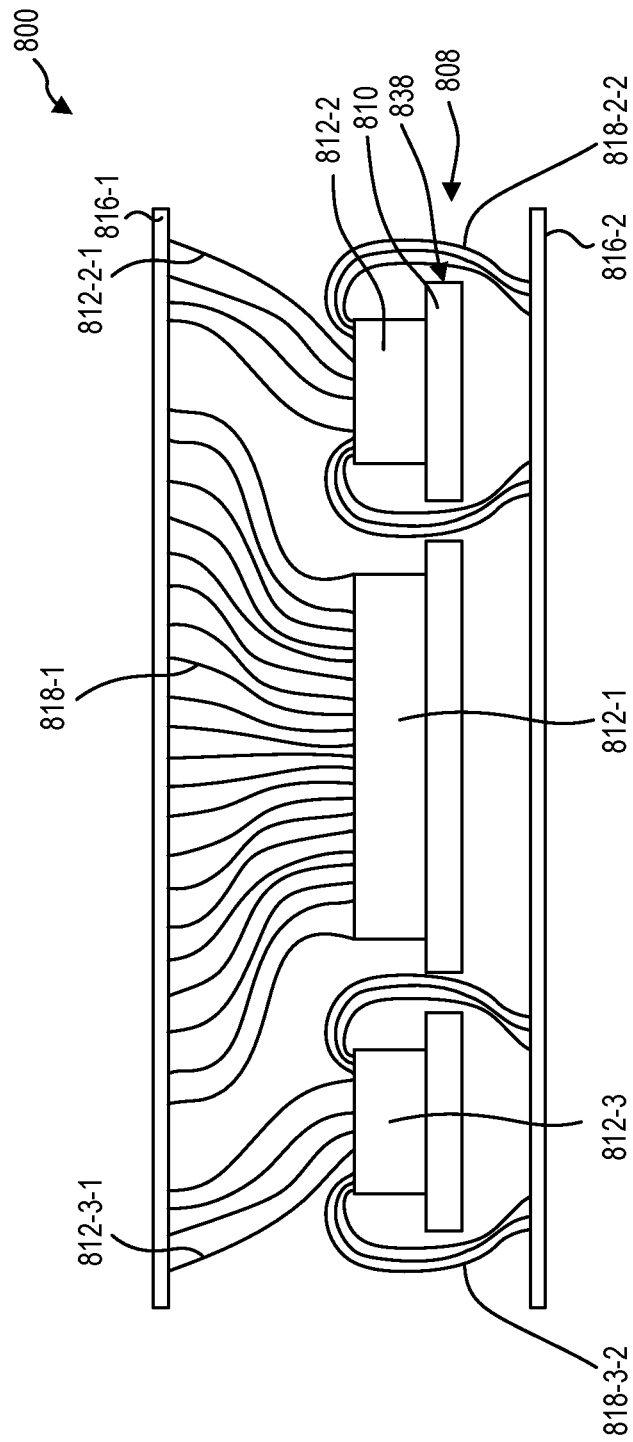
FIG. 8 is a representation of a side view of still a further electronics cooling assembly, according to at least one embodiment of the present disclosure.

FIG. 8 is a representation of a side view of an electronics cooling system 800, according to at least one embodiment of the present disclosure. The electronics cooling system 800 includes a PCB assembly 808 having heat generating components (collectively 812) connected to a base 810. A plurality of microtubes (collectively 818) may extend between the PCB assembly 808 and one or more heat plates (collectively 816).

In the embodiment shown, the plurality of microtubes 818 may conduct heat to a first heat plate 816-1 on a first side of the PCB assembly 808 and a second heat plate 816-2 on a second side of the PCB assembly 808. In some embodiments, the second heat plate 816-2 may be located on a side of the PCB assembly 808 opposite from the first heat plate 816-1. Conducting heat from the heat generating components 812 to different sides of the PCB assembly 808 may increase the average heat flux of the PCB assembly 808 that can be cooled by the cooling system.

In the embodiment shown, a first plurality of microtubes 818-1 may extend from a first heat generating component 812-1 to the first heat plate 816-1. All of the first plurality of microtubes 818-1 may extend between the first heat generating component 812-1 to the first heat plate 816-1.

A second plurality of microtubes (collectively 818-2) may be connected to the second heat generating component 812-2. A first portion 818-2-1 of the second plurality of microtubes 818-2 may extend between the second heat generating component 812-2 and the first heat plate 816-1. A second portion 818-2-2 of the second plurality of microtubes 818-2 may be routed through the base 810 and extend to the second heat plate 816-2. As discussed herein, the microtubes 818 may include one or more bends. Thus, the microtubes 818 may be routed to any location relative to the PCB assembly 808.

In some embodiments, the base 810 may include a bore 838 that extends completely through the base 810. To reach the second heat plate 816-2, the second portion 818-2-2 of the second plurality of microtubes 818-2 to the second heat plate 816-2 may be routed through the bore 838. By routing the second portion 818-2-2 to the second heat plate 816-2, average heat flux of the PCB assembly 808 that can be cooled by the cooling system may be increased.

In the embodiment shown, a third plurality of microtubes (collectively 818-2) may be connected to the third heat generating component 812-3. A first portion 818-3-1 of the third plurality of microtubes 818-3 may extend between the third heat generating component 818-3 and the first heat plate 816-1. A second portion 818-3-2 of the third plurality of microtubes 818-3 may be routed from the third heat generating component 818-3 to the second heat plate 816-2. While the embodiment shown in FIG. 8 indicates that the second plurality of microtubes 818-2 and the third plurality of microtubes 818-3 include portions that are routed to the second heat plate 816-2, it should be understood that any heat generating component 812 may include microtubes 818 that route to either one or both of the heat plates 816.

The number of the second portion 818-2-2 of the second plurality of microtubes 818-2 and/or the second portion 818-3-2 that extend to the second heat plate 816-2 may be based on the total number of microtubes 818 (e.g., the combined total number of the first, second, and third pluralities of microtubes 818-1, 818-2, 818-3), the average heat flux transferred to the first heat plate 816-1, and the cooling capacity of the cooling system. Thus, if the average heat flux of the PCB assembly 808 spread evenly over the first heat plate 816-1 exceeds the cooling capacity of the cooling system, at least a portion of the heat generated by the PCB assembly 808 may be routed to the second heat plate 816-2.

In the embodiment shown in FIG. 8, the second heat plate 816-2 is offset from the base 810. In some embodiments, the second heat plate 816-2 may contact and/or be adhered to the base 810.

While the embodiment shown in FIG. 8 shows the first heat plate 816-1 and the second heat plate 816-2 located on opposite sides of the PCB assembly 808, it should be understood that the second heat plate 816-2 and/or other heat plates may be located anywhere relative to the PCB assembly 808. For example, a heat plate may be located adjacent to the first heat plate 816-1, such as a side adjacent to the side of the first heat plate 816-1 that extends into and/or out of the page. In some examples, a heat plate may be located adjacent to the first heat plate 816-1 on the right or the left side of the first heat plate 816-1 shown in FIG. 8. In some embodiments, all six sides of the PCB assembly 808 may be surrounded by heat plates and heat may be directed to each of these heat plates using one or more microtubes 818.

Figure 9:
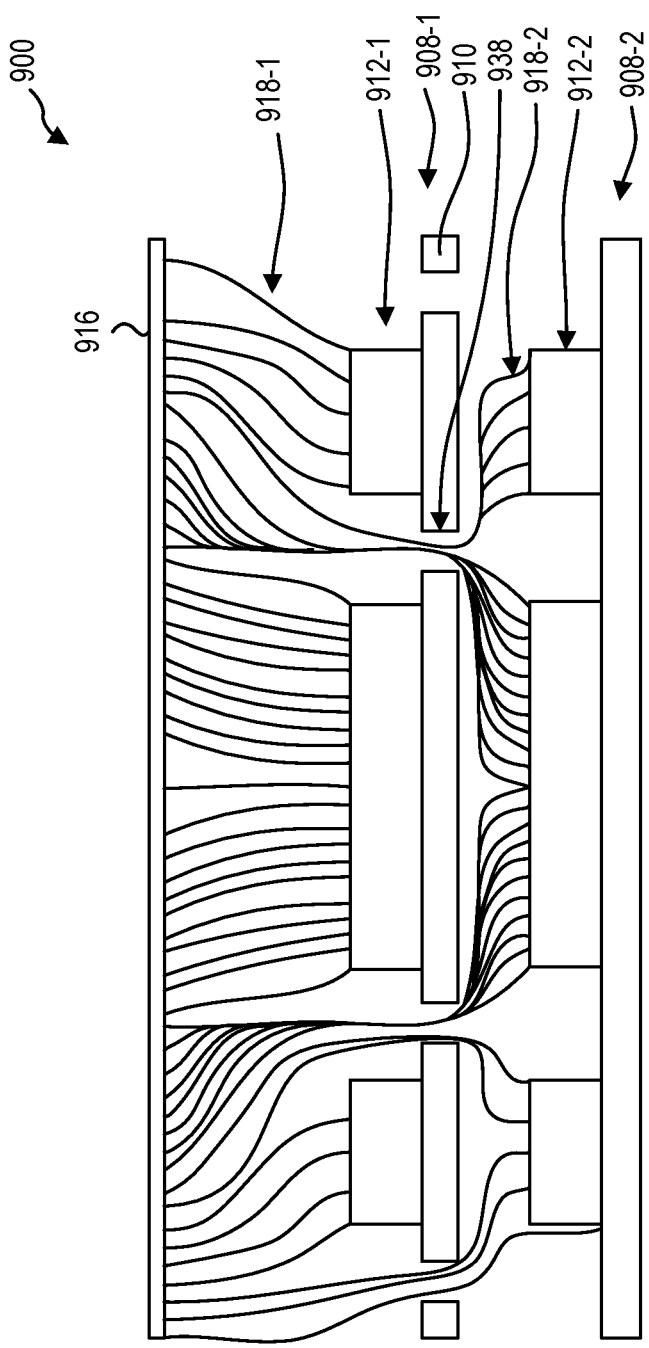
FIG. 9 is a representation of a side view of another electronics cooling assembly, according to at least one embodiment of the present disclosure.

FIG. 9 is a representation of a side view of a cooling system 900, according to at least one embodiment of the present disclosure. The cooling system 900 includes a first PCB assembly 908-1 and a second PCB assembly 908-2 layered in a three-dimensional direction (e.g., the second PCB assembly 908-2 may be located between the first PCB assembly 908-1 and the heat plate 916). The first PCB assembly 908-1 includes a first set of heat generating components 912-1. A first plurality of microtubes 918-1 extend between the first set of heat generating components 912-1 and a heat plate 916.

The first PCB assembly 908-1 includes a base 910 including one or more bores 938. The second PCB assembly 908-2 includes a second set of heat generating components 912-2. A second plurality of microtubes 918-2 are connected to the second set of heat generating components 912-2. The second plurality of microtubes 918-2 may extend through the one or more bores 938 to the heat plate 916. Thus, the heat generated by the second set of heat generating components 912-2 may be routed through the first PCB assembly 908-1.

Conventionally, stacked PCB assemblies are difficult to implement because the processors on the PCB assemblies overheat. By routing the second plurality of microtubes 918-2 through the first PCB assembly 908-1, the heat generated by the second PCB assembly 908-2 may be dissipated by the heat plate 916. In this manner, two or more PCB assemblies 908 may be stacked vertically, and the heat routed through the z-axis of the vertically stack PCB assemblies. This may increase the number of PCB assemblies that may be installed in a single rack or data center.

The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. For example, any element or feature described in relation to an embodiment herein may be combinable with any element or feature of any other embodiment described herein, where compatible.

Numbers, percentages, ratios, or other values stated herein are intended to include that value, and also other values that are "about" or "approximately" the stated value, as would be appreciated by one of ordinary skill in the art encompassed by embodiments of the present disclosure. A stated value should therefore be interpreted broadly enough to encompass values that are at least close enough to the stated value to perform a desired function or achieve a desired result. The stated values include at least the variation to be expected in a suitable manufacturing or production process, and may include values that are within 5%, within 1%, within 0.1%, or within 0.01% of a stated value.

A person having ordinary skill in the art should realize in view of the present disclosure that equivalent constructions do not depart from the spirit and scope of the present disclosure, and that various changes, substitutions, and alterations may be made to embodiments disclosed herein without departing from the spirit and scope of the present disclosure. Equivalent constructions, including functional "means-plus-function" clauses are intended to cover the structures described herein as performing the recited function, including both structural equivalents that operate in the same manner, and equivalent structures that provide the same function. It is the express intention of the applicant not to invoke means-plus-function or other functional claiming for any claim except for those in which the words 'means for' appear together with an associated function. Each addition, deletion, and modification to the embodiments that falls within the meaning and scope of the claims is to be embraced by the claims.

The terms "approximately," "about," and "substantially" as used herein represent an amount close to the stated amount that still performs a desired function or achieves a desired result. For example, the terms "approximately," "about," and "substantially" may refer to an amount that is within less than 5% of, within less than 1% of, within less than 0.1% of, and within less than 0.01% of a stated amount. Further, it should be understood that any directions or reference frames in the preceding description are merely relative directions or movements. For example, any references to "up" and "down" or "above" or "below" are merely descriptive of the relative position or movement of the related elements.

The described embodiments are to be considered as illustrative and not restrictive, and the present disclosure may be embodied in other forms besides those specifically described herein. The scope of the disclosure is, therefore, indicated by the appended claims rather than by the foregoing description. Changes that come within the meaning and range of equivalency of the claims are to be embraced within their scope.

What is claimed is:

1. A system, comprising:
   a printed circuit board (PCB) assembly including at least one heat generating component;
   a heat plate;
   a plurality of microtubes each having a first end and a second end, the first end being connected to the PCB assembly and the second end being connected to the heat plate; and
   a two-phase immersion cooling fluid.

2. The system of claim 1, wherein the heat generating component is a processor.

3. The system of claim 1, wherein the first end is connected to the PCB assembly with a first spatial density and wherein the second end is connected to the heat plate with a second spatial density.

4. The system of claim 3, wherein the first spatial density is greater than the second spatial density.

5. The system of claim 1, wherein the plurality of microtubes have a thermal conductivity that is higher than copper.

6. The system of claim 1, wherein the plurality of microtubes are formed from annealed pyrolytic graphite.

7. The system of claim 1, wherein the heat plate is a first heat plate and located on a first side of the PCB assembly, and further comprising a second heat plate located on a second side of the PCB assembly, wherein at least a portion of the plurality of microtubes are routed through the PCB assembly to the second heat plate.

8. The system of claim 7, wherein the portion of the plurality of microtubes are routed through a bore in a base of the PCB assembly.

9. The system of claim 1, wherein at least a portion of the plurality of microtubes are routed to a remote location.

10. A system, comprising:
    a heat plate;
    a printed circuit board (PCB) including a heat generating component, wherein the PCB includes a first side and a second side opposite the first side, and wherein the heat generating component is located on the first side and the heat plate is located on the second side; and
    a plurality of microtubes each having a first end and a second end, the first end being connected to the PCB and the second end being directly connected to the heat plate.

11. The system of claim 10, further comprising a two-phase immersion cooling fluid.

12. The system of claim 10, wherein the plurality of microtubes are connected to the heat generating component with a first spatial density and to the heat plate with a second spatial density, and wherein the first spatial density is greater than the second spatial density.

13. The system of claim 10, wherein the plurality of microtubes have a thermal conductivity that is higher than copper.

14. The system of claim 10, wherein the plurality of microtubes are formed from annealed pyrolytic graphite.

15. The system of claim 12, further comprising a second plurality of microtubes connected to the heat generating component with a third spatial density and to the heat plate with a fourth spatial density.

16. The system of claim 10, wherein at least a portion of the plurality of microtubes are routed to a remote location.

17. A system, comprising:
    a printed circuit board (PCB) assembly, the PCB assembly including:
       a base;
       a first heat generating component connected to the base, the first heat generating component having a first heat flux; and
       a second heat generating component connected to the base, the second heat generating component having a second heat flux different from the first heat flux;
    a heat plate;
    a first plurality of thermally conductive microtubes extending from the first heat generating component to the heat plate, the first plurality of thermally conductive microtubes being connected to the first heat generating component with a first spatial density and the heat plate with a heat plate spatial density; and
    a second plurality of thermally conductive microtubes extending from the second heat generating component to the heat plate, the second plurality of thermally conductive microtubes being connected to the second heat generating component with a second spatial density and the heat plate with the heat plate spatial density.

18. The system of claim 17, wherein the heat plate spatial density is less than at least one of the first spatial density or the second spatial density.

19. The system of claim 17, wherein the first heat generating component and the second heat generating component are computing elements having a different intended use.

20. The system of claim 17, wherein the PCB assembly is a first PCB assembly and further comprising a second PCB assembly between the first PCB assembly and the heat plate, and wherein at least a portion of the first plurality of thermally conductive microtubes are routed through the first PCB assembly to the heat plate.

* * * * *